United States Patent [19]

Yoshida et al.

[11] 4,075,827

[45] Feb. 28, 1978

[54] ADJUSTABLE CIRCUIT FOR AN ELECTRONIC TIMEPIECE

[75] Inventors: Makoto Yoshida; Yoshifumi Mochizuki, both of Tokorozawa; Masamichi Yamauchi, Ichikawa; Hideyuki Kawashima, Higashi Kurume, all of Japan

[73] Assignee: Citizen Watch Co., Ltd., Tokyo, Japan

[21] Appl. No.: 708,221

[22] Filed: Jul. 23, 1976

[30] Foreign Application Priority Data

Aug. 1, 1975 Japan ........................ 50-94010

[51] Int. Cl.2 ........................ G04C 3/00; H03K 5/159; H03B 3/04

[52] U.S. Cl. ........................ 58/23 AC; 328/55; 331/177 R

[58] Field of Search .............. 58/23 AC, 85.5; 328/55

[56] References Cited

U.S. PATENT DOCUMENTS

| | | | |
|---|---|---|---|
| 3,841,081 | 10/1974 | Komaki | 58/23 R |
| 3,967,442 | 7/1976 | Berney | 58/23 R |

*Primary Examiner*—E. S. Jackmon

*Attorney, Agent, or Firm*—Koda and Androlia

[57] ABSTRACT

An adjustable circuit for an electronic timepiece including a crystal oscillator, a frequency divider circuit, a display and a controlable means for increasing and decreasing the output frequency of the frequency divider circuit. The increasing and decreasing means includes a digital adder and a digital subtractor and a plurality of controlable gates for enabling the digital adder or subtractor to increase or decrease the output frequency of the frequency divider.

13 Claims, 4 Drawing Figures

ADJUSTABLE CIRCUIT FOR AN ELECTRONIC TIMEPIECE

BACKGROUND OF THE INVENTION

1. Field of Invention

This invention relates to circuits for electronic timepieces and in particular to circuits for electronic timepieces which are adjustable.

2. Description of the Prior Art

Although the high accuracy and excellent stability of electronic timepieces, especially those with quartz crystal oscillators, it is generally recognized, their popularity has not been up to expectations. The underlying reason for this has been their high cost as timepieces and problems encountered in the mass production of the quartz crystal oscillator and other segments of the electronic timepiece.

Although high precision of individual parts is a necessary condition for mass production of quartz crystal timepieces, discrepancies must inherently be allowed to exist to a certain extent. For instance, it is necessary to provide some means of adjusting for a combination of a quartz crystal oscillator having a certain natural frequency and its oscillator circuit. Frequently a trimmer condenser or the like is presently used for this type of adjustment. However, during the manufacturing process, crystals that have a natural frequency which is unadjustable by means of a trimer condenser or like means must be discarded. Furthermore, according to the prior art the frequency of the oscillator circuit has been continuously adjusted by altering the capacitances of trimer condensers and thus changing the value of the perameter of the feedback element of the oscillator circuit that contains the quartz crystal oscillator.

However, this method of frequency adjustment by means of a trimer capacitor has the following shortcomings:

(1) The adjustable range of the frequency is limited as a result of the constraints of the natural frequency and the quality factor of the quartz crystal oscillator;

(2) Since the trimer condenser is bulky and expensive, it is not a suitable component for a wrist watch; and (3) The use of an adjustable component which has poor long term stability results in adverse effects upon the precision of the timepiece as a result of temperature changes and aging of the component.

In veiw of these defects, so-called digital frequency adjustment has appeared in practice. Digital frequency adjustment usually takes the form of a conventional frequency adjustment method via a trimer condenser or independent adjustment in which the division ratio of the divider circuit is changed by a combination of integrated circuits. However, the digital frequency adjustments currently practiced are of the so-called unit directional adjustment type in which the divider is equiped with either an adder or a subtractor circuit, and unlike the trimer capacitor frequency adjustment method, the frequency of the quartz crystal oscillator circuit is changed from its natural value either to a lower value or to a higher value but not both. This system has shortcomings such as a limitation in flexibility when a quartz crystal oscillator is processed for frequency adjustments and a difficulty in coping with the frequency change due to aging of the quartz crystal oscillator.

SUMMARY OF THE INVENTION

Accordingly, it is a general object of the present invention to provide a circuit for an electronic timepiece in which, by a simple control method, it is possible to increase or decrease over a predetermined frequency range the output frequency of the divider.

It is another object of the present invention to provide an adjustable circuit for an electronic timepiece which is simple and inexpensive.

It is yet another object of the present invention to provide an adjustable circuit for an electronic timepiece which has three states of frequency adjustment, frequency increase, frequency decrease or no change.

It is yet another object of the present invention to provide an adjustable circuit for an electronic timepiece where the frequency can be adjusted via a single frequency setting terminal.

It is also an object of the present invention to provide an adjustable circuit for an electronic timepiece which lowers the production costs by adopting a common value as the nominal value of the frequency of the quartz crystal oscillator which can be used in either an electronic timepiece having the frequency adjustment feature or in an electronic timepiece that does not have the frequency adjustment feature.

In keeping with the principles of the present invention, the objects are accomplished by a unique frequency adjustable circuit for an electronic timepiece including a crystal oscillator, a means for converting the signal from the crystal oscillator into a train of digital pulses, a frequency divider circuit for dividing the frequency of the train of digital pulses into a train of output pulses of the lower frequency, a display, and a controlable means for increasing or decreasing the frequency of the output pulses from the frequency divider circuit. The adding and subtracting means included a digital adder and a digital subtractor and a plurality of controlable gates for enabling either the digital adder or the digital subtractor to increase or decrease the output frequency of the pulses from the frequency divider circuit.

BRIEF DESCRIPTION OF THE DRAWINGS

The above-mentioned and other features and objects of the present invention will become more apparent by reference to the following description taken in conjunction with the accompanying drawings, wherein like referenced numerals denote like elements, and in which.

DETAILED DESCRIPTION OF THE INVENTION

Figure 1:
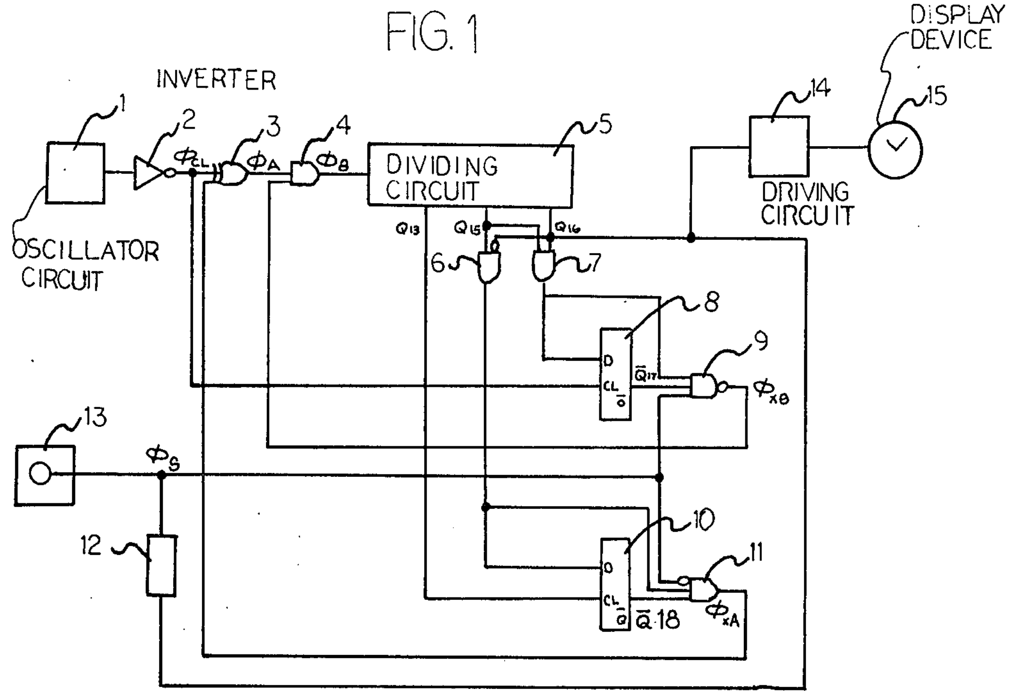
FIG. 1 is a circuit diagram of an adjustable circuit for an electronic timepiece in accordance with the teachings of the present invention.

Referring more particularly to the drawings, FIG. 1 is a circuit diagram of a frequency adjustable circuit for an electronic timepiece in accordance with the teachings of the present invention. In FIG. 1, the frequency circuit includes an oscillator circuit 1 having its output coupled to the input of an inverter 2. The output of inverter 2 is a signal $\phi_{CL}$ and it is applied to one input of exclusive-or circuit 3. The output signal $\phi_A$ of exclusive-or circuit 3 is applied to an input of And gate 4. The output signal $\phi_B$ is applied to the input of frequency dividing circuit 5. Frequency dividing circuit 5 consists of sixteen flip-flops coupled together in series such that the frequency of the signal applied to the input of the first flip-flop is divided down by each successive flip-flop through the chain. The Q output signal Q 16 from the sixteenth flip-flop in divider circuit 5 is applied to one input of And gate 7. The Q 16 signal is also applied to the inverted imput of And gate 6. The output signal from the Q output of the fifteenth flip-flop Q 15 is applied to the other input of And gate 6 and to an input of And gate 7. The Q 16 signal is also applied to the input of driving circuit 14 and the output of driving circuit 14 is applied to display device 15. Furthermore, the Q 16 signal is applied to one end of resistor 12 and the other end of resister 12 is connected to frequency adjustment terminal 13.

The output signal Q 13 from the thirteenth flip-flop of the divided circuit 5 is coupled to the clock input of data flip-flop 10. The output of And gate 6 is coupled to the data input of data flip-flop 10 and to an input of And gate 11. The output of And gate 7 is coupled to the data input of data flip-flop 8 and to one input of Nand gate 9.

The $\phi_{CL}$ signal from the output of inverter 2 is also applied to the clock input of data flip-flop 8. The signal $\phi_S$ from frequency adjustment terminal 13 and resister 12 is coupled to an input of Nand gate 9 and on invert input of And gate 11. The output signal $\phi_{XB}$ of Nand gate 9 is coupled to an input And gate 4 and the output signal $\phi_{XA}$ of And gate 11 is coupled to the other input of exclusive-Or gate 3. The $\overline{Q}$ output signal $\overline{Q}$ 17 of data flip-flop 8 is coupled to an input of Nand gate 9 and the $\overline{Q}$ signal $\overline{Q}$ 18 of data flip-flop 10 is coupled to input of And gate 11.

In operation, inverter 2 acts as a squaring circuit to convert the signal from oscillator circuit 1 into a square wave signal. Furthermore, exclusive-Or gate 3 and And gate 4, respectively operate as a digital adder and subtractor. Furthermore, in operation signal $\phi_S$, a combination signal comprising the signal Q 16 and the signal applied to frequency assignment terminal 13, is the assignment signal which controls the adding and the subtracting function.

When the signal at frequency assignment pin 13 is an electrically open state (OPEN) the $\phi_S$ signal will be equal to the signal Q 16 and will continually switch from a high signal (HIGH) to a low signal (LOW) and the number of HIGHS and LOWS will be equal. When the signal $\phi_S$ is a HIGH, Nand gate 9 is opened and will pass signals to And gate 4 thereby causing subtraction to occur. When the signal $\phi_S$ is a LOW, And gate 11 will be turned on and will pass signals to Exclusive-or gate 3 thereby causing addition to occur. Accordingly, since with an OPEN applied to terminal 13 the signal $\phi_S$ switches between an equal number of HIGHS and LOWS, an equal number of additions and subtractions are performed and no adjustment results in the frequency of the watch.

If, on the other hand, a LOW is applied to the frequency assignment pin 13, the assignment signal $\phi_S$ is at a low level and only And gate 11 will be opened and only addition will occur at exclusive Or gate 3. Therefore, the frequency of the circuit will be adjusted upwardly. If a HIGH is applied to the frequency adjustment terminal 13, only And gate 9 will be opened thereby causing subtraction to occur at And gate 4. Accordingly, when a HIGH is applied to frequency adjustment terminal 13, the frequency of the circuit is adjusted downwardly. From the foregoing description, it should be apparent that by applying either a HIGH, a LOW or an OPEN to frequency adjustment terminal 13, three distinct states of operation can occur in the circuit.

In practice, in this embodiment, the entire period of operation within which addition and subtraction are performed alternately is a period of one second. However, it is generally possible to make additions and subtractions alternately with the frequency of $2^h$ (where $h$ is a non-negative integer). Furthermore, although it is not impossible to operate with a period longer than two seconds, it is ideal to use a period shorter than two seconds in order to maintain a desirable relationship with the time counter.

Figure 2:
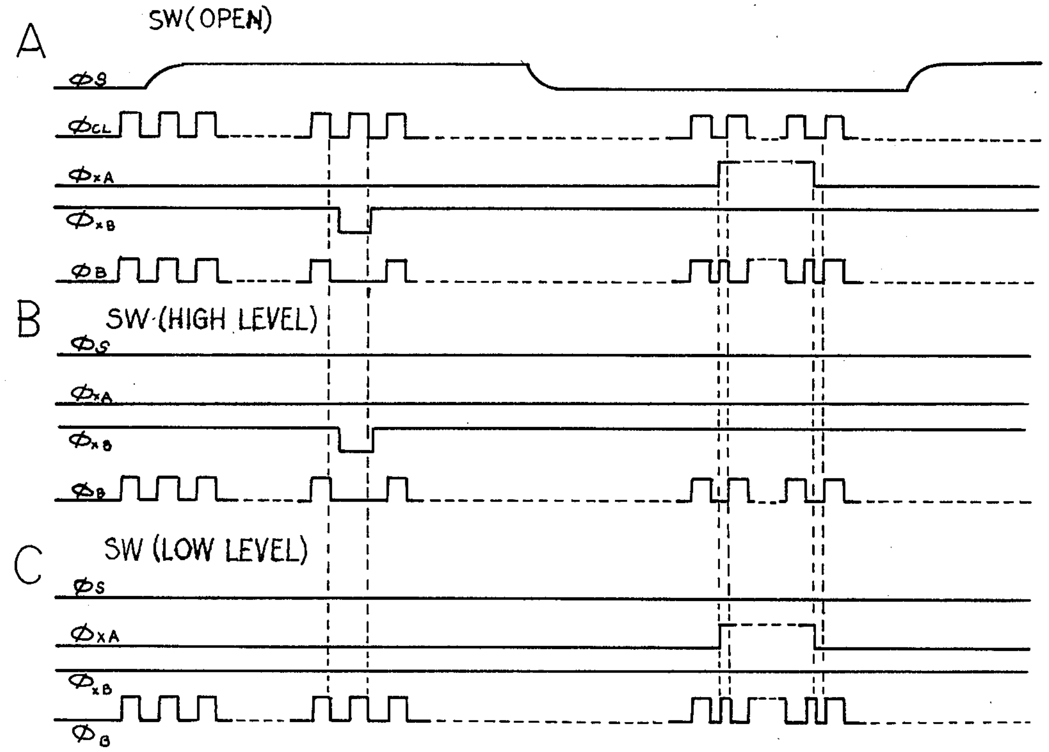
FIG. 2 is a graphical representation of the wave forms at various points in the embodiment of FIG. 1.

Referring to FIG. 2, shown therein is a time graph in which wave forms at various points of the embodiment of FIG. 1 are shown. In the time graph of FIG. 2 is shown the relationship between the assignment signal $\phi_S$ and the clock signal $\phi_{CL}$ versus the signals $\phi_{XA}$, $\phi_{XB}$ and the input signal $\phi_B$ to the divider circuit 5. In the A portion of FIG. 2 is shown the state in which the signal applied to the frequency assignment pin 13 is an OPEN and accordingly both additions and subtractions are performed alternately. In the B portion of FIG. 2 is shown the state in which a HIGH is applied to the frequency assignment pin 13 and only subtractions are performed. In the C portion of FIG. 2 is shown the state in which a LOW is applied to the frequency assignment pin 13 and only additions are performed.

Accordingly, in light of the described invention, since it is effectively possible to set the divider ratio of the divider circuit 5 in three different states, it is possible to mass produce electronic time pieces of a homogeneous precision by selecting the quartz crystal oscillators with respect to their natural frequencies in three stages and then combining the crystals in each stage with one of the assigned divider ratio values of the divider circuit 5. Furthermore, since the three different division ratio assignments can be realized by only a single frequency assignment pin 13 provided on the integrated circuit, the number of external pins of the integrated circuit is reduced, thereby contributing to a cost reduction and improved reliability. Furthermore, finer adjustments of the frequency are possible by increasing the number of frequency assignment pins and by assigning a different bit time to each pin.

Figure 3:
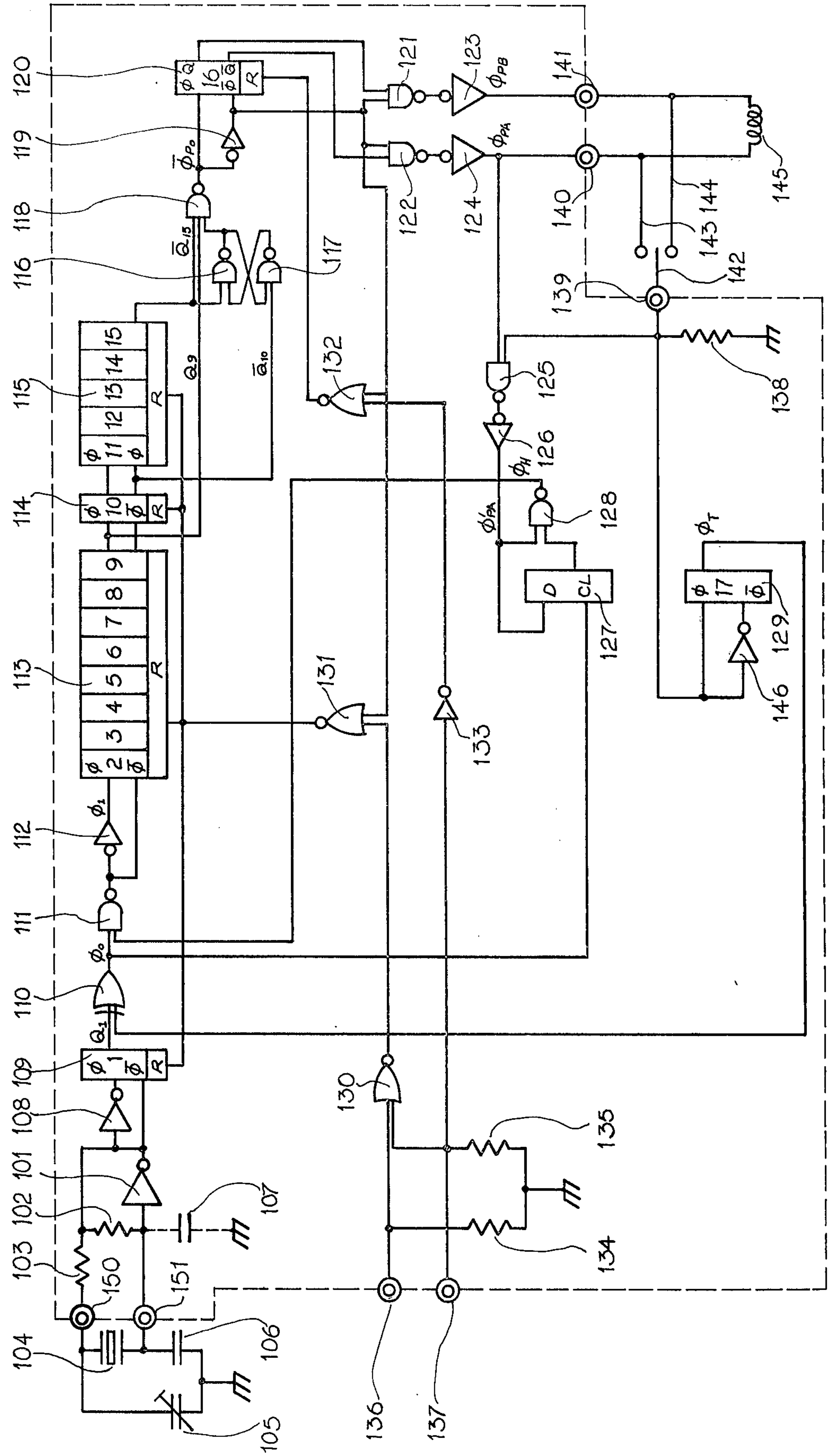
FIG. 3 is a second embodiment of a frequency adjustable circuit for an electronic time piece in accordance with the teachings of the present invention.

Referring to FIG. 3, shown therein is a second embodiment of a frequency adjustable circuit for an electronic timepiece. The circuit of FIG. 3 includes an inverter 101 having a feedback resistor 102 coupled between its input and output and a stabilizing resistor coupled from the output of inverter 101 to pin 150. The input of inverter 101 is connected to a pin 151, a quartz crystal oscillator 104 is connected between pins 150 and 151 and a trimer condenser 105 is coupled between pin 150 and ground and a condenser 106 is coupled between pin 151 and ground. A second condenser 107 similar to condenser 106, and is shown for the on chip case, is artificial and not essential to the circuit of this embodiment. The output of inverter 101 is fed into inverter 108 and the output of inverter 108 is the signal $\phi$ which is fed into the $\phi$ input of flip-flop 109. Flip-flop 109 is the first stage of the divider stages into which the output of inverter 101 is applied. Furthermore, the output of inverter 101 is also applied to the $\bar{\phi}$ input of flip-flop 109 and the Q output signal Q 1 is applied to input of exclusive Or gate 110 which performs the addition function. The reset terminal of flip-flop 109 is connected to the output of Nor gate 131.

The output signal $\phi_0$ of the exclusive Or gate 110 supplied to an input of Nand gate 111 which performs the subtraction function and also supplied to the clock input of the data flip-flop 127. The output signal of Nand gate 111 is applied directly to the $\bar{\phi}$ input of flip-flop 2 and is also applied to the $\phi$ input of flip-flop 2 after passing through inverter 112 (the output signal of inverter 112 is designated as $\phi_1$), where flip-flop 2 is the first flip-flop of the flip-flops 2 through 9 which are shown as a single block 113.

In block 113, the Q output of each flip-flop is connected to the $\phi$ input of the next flip-flop while the $\bar{Q}$ output of each flip-flop is connected to the $\bar{\phi}$ input of the next flip-flop and the Q output signal $Q_9$ of the last flip-flop (flip-flop 9) becomes the $\phi$ input of flip-flop 10 (block 114) and also an input of Nand gate 118, while the $\bar{Q}$ output signal of flip-flop 9 is connected to the $\bar{\phi}$ input of flip-flop 10 (block 114). The Q output of flip-flop 10 (block 114) becomes the $\phi$ of flip-flop 11 in block 115 while the $\bar{Q}$ output signal $\bar{Q}$ 10 becomes the $\bar{\phi}$ input of flip-flop 11 as well as the input to Nand gate 117. Block 115 consists of flip-flops 11 through 15 in which the Q outputs of each flip-flops are coupled to the $\phi$ input of the next flip-flop and the $\bar{Q}$ output is applied to the $\bar{\phi}$ input of the next flip-flop. The $\bar{Q}$ output signal $\bar{Q}$ 15 of flip-flop 15 is coupled to Nand gate 118 and to Nand gate 116. Furthermore, all the reset terminals of flip-flops 2 through 15 (113, 114 and 115) are connected together to the output of Nor gate 131.

Nand gate 116 and Nand gate 117 are connected together so as to form an R.S. type flip-flop. The inputs to Nand gate 116 are the signal $\bar{Q}$ 15 and the output of Nand gate 117. The output of Nand gate 116 is coupled to the input of Nand gate 118. The output of Nand gate 116 is also coupled to the input of Nand gate 117.

The output signal $\bar{\phi}_{PO}$ of Nand gate 118 is coupled directly to the $\phi$ of flip-flop 120 and is also coupled via an inverter 119 to the $\bar{\phi}$ input of flip-flop 120 as well as to the input of Nand gates 121 and 122 and Nor gates 131 and 132. The input to Nand gate 121 is coupled to the Q output of flip-flop 16 (120) and the $\bar{Q}$ output of flip-flop 16 is coupled to the input of Nand gate 122. The reset terminal of flip-flop 16 (120) has as its input the output of Nand gate 132. The output of Nand gate 122 becomes the signal $\phi_{PB}$ after passing through inverter 123 is coupled to pin 141. Furthermore, the output of Nand gate 122 after becoming signal $\phi_{PA}$ after passing through the inverter 124 is coupled to terminal 140 as well as being applied to the input of Nand gate 125.

Both ends of coil 145 are connected respectively to terminals 140 and 141. Switch terminal 143 is coupled to terminal 140 and switch terminal 144 is connected to terminal 141. Switching contact 142 is connected to terminal 139 and is connected to the input of Nand gate 125, the $\phi$ input to flip-flop 17 (129) and the $\bar{\phi}$ input of flip-flop 17 (129) via an inverter 146, and is also grounded via resister 138. The output of Nand gate 125 becomes the signal $\phi'_{PA}$ after passing through inverter 126 and is applied to the input of Nand gate 128 and also to the data input of data flip-flop 127. The $\bar{Q}$ output of data flip-flop 127 is applied the input of subtraction Nand gate 111. The Q output signal $\phi_T$flip-flop 17 (129) is applied to an input of the exclusive Or gate 110.

The first terminal 136 for zero setting is grounded via resister 134 and also is applied to the input of Nor gate 130. The output of Nor gate 130 is applied to the input of Nor gate 131. The second terminal 137 for zero setting is grounded via resister 135 and is also applied to the input of Nor gate 130 and to the input of Nor gate 132 via inverter 133.

It should be noted at this time that in the preferred embodiment all of the components located within the dotted line in FIG. 3 can be formed on a single chip of CMOSIC (complimentary metal oxide semi-conductor integrated circuit) thereby greatly reducing the cost of manufacture and greatly increasing the ease of assembly.

In operation quartz crystal oscillator together with inverter 101 and capacitor 107 generates an oscillatory signal of a specific frequency. This signal and the inverted signal produced by inverter 108 are divided by flip-flop 1 (109). The signal from flip-flop 1 (109) is supplied to the input of exclusive-Or circuit 110 and in addition, is performed (as explained hereinbelow) followed by a subtraction by Nand gate 111 (as explained hereinbelow). The inverted signal from inverter 112 is then divided by flip-flops 2 through flip-flop 9 and then divided further by flip-flops 114 and flip-flops 11 through 15. Since the frequency of the quartz crystal oscillator is 32,768 Hz, the period of the output signal from 115 is one second. The pulse width which is necessary to drive the pulse motor is rendered by the waveshaping circuit that consists of gates 116, 117 and 118 where the required pulse width is achieved by taking a logical product of the Q and $\bar{Q}$ outputs of flip-flop 16 (120). The hands on the face of the time piece (not shown on the figure) will operate incrementally because the current through the coil 145 of stepping motor reverses its direction once every second, which is obtained by connecting a two-phase output after amplification from driving inverters 123 and 124 and supplying it to the output terminals 140 and 141.

In addition to the operation of the circuit that has been disclosed hereinabove, the key point of the invention is the manner in which the adder exclusive-Or 110 and subtractor Nand gate 111 is operated and a detailed explanation of the operation is given below.

The adder is basically a phase shifter that uses an exclusive-Or circuit and the subtraction is achieved by closing a gate for an assigned period. Thus halting the operations of dividers 113, 114, 115 and 120. Since the period of oscillation of the quartz crystal oscillator is about 30 micro-seconds, the length of the periods for the logical one and the logical zero are both 30 microseconds. One input of exclusive Or 110 is connected to the output signal Q 1 of flip-flop 1 (109) and another input is supplied from flip-flop 17 (129). The output signal for the motor coil 145 is applied to flip-flop 17 (129) when either the switching contact 142 is connected to switch terminal 143 or connected to switch terminal 144. The state of the signal applied to the motor coil 145 changes every 2 seconds.

Figure 4:
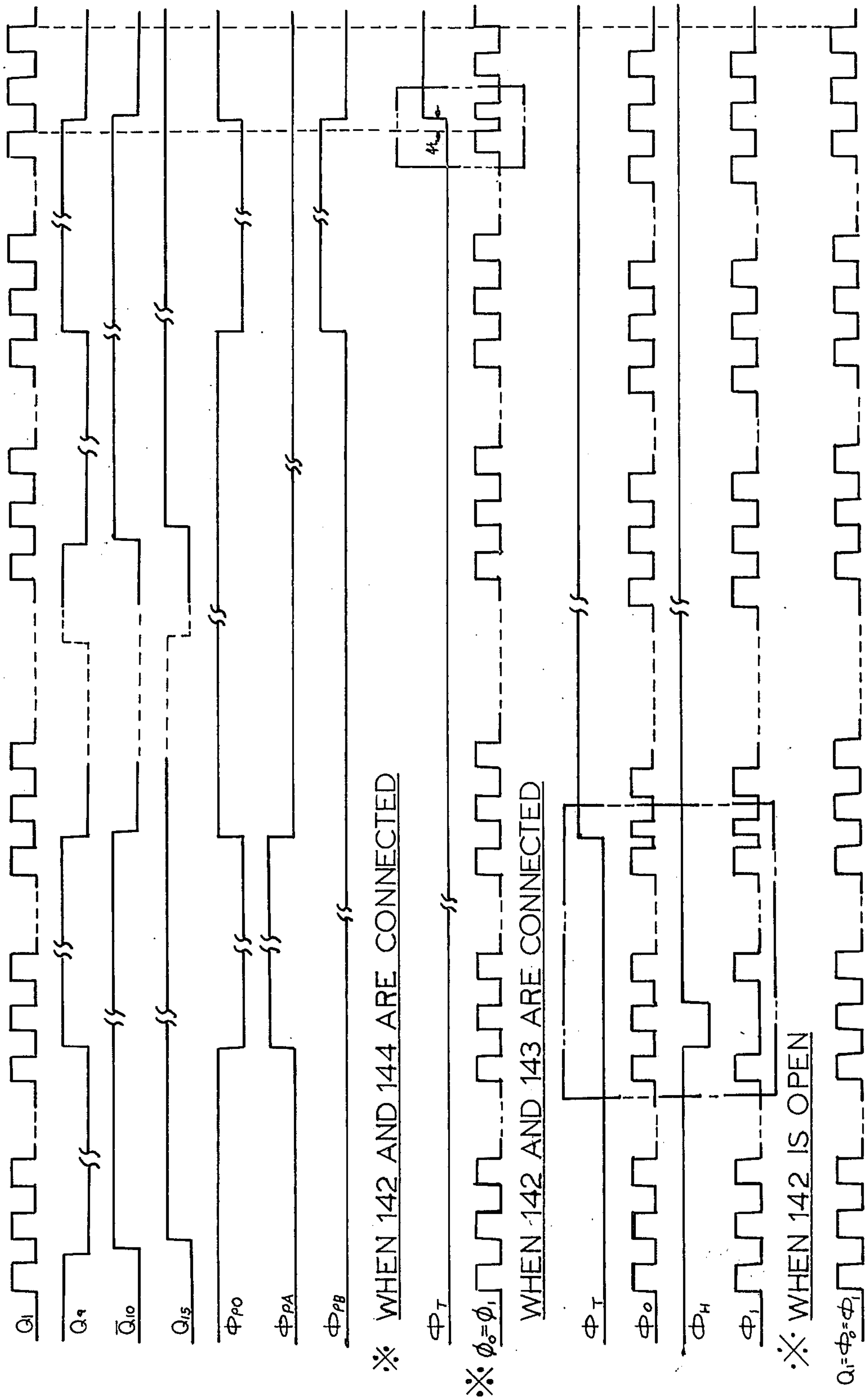
FIG. 4 is a graphical representation of the wave forms at various points in the embodiment of FIG. 3.

The signal patterns at various points of FIG. 3 are shown in FIG. 4. As shown in FIG. 4, the output signal from the exclusive-Or gate 110 changes its state when a change of state occurs in the output signal $\phi_T$of flip-flop 17 (129) and as a consequence, one pulse that amounts to a phase shift due to a delay in the operation of divider 113 is added. FIG. 4 shows the case where the signal $\phi_T$ from flip-flop 17 (129) changes from a zero to a one, but it should be readily apparent that an addition is likewise performed when the signal changes from a 1 to a 0. Since the addition is performed at a rate of one pulse added every 2 seconds, the output phase of $\phi_0$ is advanced by a time increment which amounts to a half period. Since the amount of phase advance is 30 micro-seconds every 2 seconds, the phase advance is 15 micro-seconds per second.

Subtraction is accomplished in the following manner. Since the output $\phi_0$ from the exclusive Or gate 110 is a pulse train with a 60 micro-second period (excluding the time when an addition is being performed) and if a single pulse is subtracted by some means, the input signal to divider 113 will arrive 60 micro-seconds later than in the normal case. As a consequence, the output signal that is led to terminals 140 and 141 will also be delayed by 60 micro-seconds. To obtain a delay of 15 micro-seconds per second, first a delay of 60 micro-seconds per 2 seconds is produced by subtractor 111 and then advanced 30 micro-seconds using two adders or in other words, a delay equal to $(-60 + 30)$ divided by two equals $-15$ micro-seconds can be achieved.

It can be seen from the above description that a 15 micro-second advance is achieved solely by means of an addition and a 15 micro-second delay is achieved by performing an addition and a subtraction. Furthermore, during the process of subtraction, switching contact 142 is coupled to terminal 143 so that the output signal from inverter 124 is transmitted to gates 125 and 126 which form a phase discrimination circuit and the resulting signal is applied to the data input of the data flip-flop 127. Since the signal from switching contact 142 is also applied to gate 128 with a delay of one period caused by the signal of the exclusive-Or gate 110, the output wave form of signal $\phi_H$ becomes a zero over a one cycle period (60 micro-seconds) and as a consequence, a subtraction is formed because the subtractor 111 does not change the state of its output.

Focusing attention on the signal $\phi_1$ in FIG. 4, it can be seen that it behaves like $\phi_0$ so long as $\phi_0$ is a logical one, but no signal appears in $\phi_1$ when $\phi_H$ is a logical zero. Furthermore, $\phi_0$ operates similarly when $\phi_T$ changes from a logical zero to a logical one and an addition is performed.

Accordingly, a three-stage logic is achieved by a single input terminal 139, which is a feature of this invention. Namely, the delay and advance of 15 micro-seconds are achieved by switching contact 142 connected to input terminal 139 between terminals 142 and 144 coupled respectively to output terminals 140 and 141. Furthermore, if switching terminal 142 is not connected to either 143 or 144, the signal from the quartz crystal oscillator will be normally divided since the control signals $\phi_T$ and $\phi_H$ for the adder 110 and the subtractor 111 do not change state and the signal from flip-flop 1 (109) is transmitted to the divider 113 without any delay or advance. Therefore, it is possible to make three kinds of adjustments, plus and minus 15 parts per million and zero, with respect to the basic frequency of the quartz crystal oscillator. If the circuit is realized by an integrated circuit, the connection for the state selected from the three possibilities can be facilitated by placing the terminal 139 between the terminals 140 and 141.

In order to operate the system as a timepiece, a reset action becomes necessary. In this embodiment, two reset terminals 136 and 137 are provided for this purpose so that flip-flops 1 through 15 are reset when terminal 136 is made a logic one and flip-flops 1 through 16 are reset when terminal 137 becomes logic one. Since a flip-flop 16 (120) will not be reset when terminal 136 is used, it remembers the state just before the application of the reset signal. Accordingly, the output signal that arrives at the output terminal is opposite to the prior one. On the other hand, since flip-flops 1 through 16 are reset when terminal 137 becomes logic 1, it is designed in such a manner that the first output pulse after the reset signal is released will always appear at the terminal 141, a consideration which is made in the design so that a free selection of the modes of operation is allowed depending upon the construction and structure of the time piece. Also the circuit is designed such that a reset signal applied when there exists an output pulse to the coil 145 will not cause the flip-flops to reset until the output pulse ceases.

As explained in detail in the foregoing, the use of a frequency adjustable circuit for an electronic timepiece in accordance with the teachings of the present invention has the following features:

(1) Large scale corrections are allowed for frequency deviations from a desired frequency that are caused by parametric variations in the quartz crystal oscillator, oscillator circuit, etc.

(2) Additions and subtractions in this invention are set at plus or minus 15 parts per million but the principle can be extended to such ranges as plus or minus 7.5 parts per million, plus or minus 30 parts per million, etc.

(3) Since the adder and subtractor in this embodiment are located after a single stage divider, there is substantially no increase in power consumption when they are operated.

(4) Since the frequency adjustment function can be achieved by only increasing the number of terminals by 1, there will no adverse effects on the size and cost when an integrated circuit is used.

(5) Since two kinds of reset terminals are provided, different types of timepieces can be operated by an identical integrated circuit.

Furthermore, it should be apparent to one skilled in the art that even though the embodiments described above are described in terms of a stepping motor, a similar technique applies to electronic time pieces using LED, liquid crystal or other types of digital displays.

In all cases it is understood that the above-described embodiments are merely illustrative of but a few of the many possible specific embodiments which represent the applications of the principles of the present invention.

Furthermore, numerous and varied other arrangements could be readily devised in accordance with the principle of the present invention by those skilled in the art without departing from the spirit and scope of the invention.

I claim:

1. A circuit for an electronic timepiece of the type having a piezo-electric reference oscillator, an oscillator circuit coupled to said reference oscillator for producing an electrical oscillation of a predetermined frequency, a divider circuit that divides the frequency of said oscillation, and a driving circuit which drives a display unit using the output of said divider circuit, characterized by the inclusion in said divider circuit of an adder circuit comprising an adder gate and a subtraction circuit comprising a subtraction gate arranged in series with said adder circuit.

2. A timepiece circuit according to claim 1, further comprising a frequency adjustment pin coupled to said gates which combined with a plurality of existing pins for other functions, can provide for three types of frequency adjustment.

3. A timepiece circuit according to claim 2, in which the said pins used for other functions are output pins for driving a pulse motor coil.

4. A timepiece circuit according to claim 2, in which said output pins are electrical source terminals.

5. A timepiece circuit according to claim 2, which has frequency adjustment values that are determined by combinations of a number of operations of the said adder and subtracter gates.

6. A timepiece circuit according to claim 5, in which the said values of frequency adjustment are 0 and $\pm 15$ PPM $\times$ $2^n$ (where $n$ is an integer).

7. A timepiece circuit according to claim 4, in which the said gates for addition and subtraction are inserted just ahead of the first stage of the divider circuit.

8. A timepiece circuit according to claim 3, in which the said gates for addition and subtraction are inserted between the first and second stages of the divider circuit.

9. A timepiece circuit according to claim 1, in which the said adder gate is an EXCLUSIVE-OR gate.

10. A timepiece circuit according to claim 1, in which the timing signal which operates said adder gate is different from the timing signal which operates said subtractor gate.

11. A timepiece circuit according to claim 1, in which the addition and subtraction processes terminate in two seconds.

12. A timepiece circuit according to claim 3, in which the said frequency assignment pin is located between two of said output pins of an integrated circuit.

13. A frequency adjustable circuit for an electronic timepiece comprising:

- a crystal oscillator circuit for producing a periodic signal having a fixed frequency;
- a frequency divider circuit for dividing the frequency of said periodic signal;
- a display for displaying the time;
- a display driver circuit for driving said display with time signals derived from said divided periodic signal; and
- a controllable means coupled to said frequency divider circuit for increasing and decreasing the frequency of said divided periodic signal, said controllable means comprising:
  - an adder circuit coupled to said frequency divider circuit;
  - a subtracter circuit coupled in series with said adder circuit to said frequency divider circuit; and
  - a plurality of controllable logic gates for enabling said adder or subtracter to increase or decrease the frequency of said divided periodic signal.

* * * * *